United States Patent
Park et al.

(10) Patent No.: US 8,702,365 B2
(45) Date of Patent: Apr. 22, 2014

(54) SUBSTRATE PROCESSING APPARATUS AND METHOD FOR TRANSFERRING SUBSTRATE FOR THE APPARATUS

(75) Inventors: Sun Yong Park, Chungcheongnam-do (KR); Choon Sik Kim, Chungcheongnam-do (KR); Jeong Yong Bae, Chungcheongnam-do (KR)

(73) Assignee: Semes Co., Ltd., Chungheongnam-do (KR)

( * ) Notice: Subject to any disclaimer, the term of this patent is extended or adjusted under 35 U.S.C. 154(b) by 1272 days.

(21) Appl. No.: 12/544,552

(22) Filed: Aug. 20, 2009

(65) Prior Publication Data

US 2010/0047045 A1    Feb. 25, 2010

(30) Foreign Application Priority Data

Aug. 20, 2008 (KR) .................. 10-2008-0081485

(51) Int. Cl.
    *H01L 21/677* (2006.01)
(52) U.S. Cl.
    USPC ............ 414/217; 414/940; 414/626; 414/814
(58) Field of Classification Search
    USPC .................... 414/217, 626, 814, 940, 281
    See application file for complete search history.

(56) References Cited

U.S. PATENT DOCUMENTS

| | | | |
|---|---|---|---|
| 6,641,350 B2* | 11/2003 | Nakashima et al. | 414/217 |
| 7,740,437 B2* | 6/2010 | De Ridder et al. | 414/217.1 |
| 2007/0125404 A1* | 6/2007 | Davis et al. | 134/33 |

FOREIGN PATENT DOCUMENTS

| | | |
|---|---|---|
| JP | H10-250836 | 9/1998 |
| JP | 2000-53237 | 2/2000 |
| JP | 2005-150129 | 6/2005 |
| JP | 2006-051886 | 2/2006 |
| JP | 2006-120658 | 5/2006 |
| JP | 2007-096140 | 4/2007 |
| JP | 2007096145 | 4/2007 |
| JP | 2007096145 A1 | 4/2007 |
| JP | 2007-142447 | 6/2007 |
| JP | 2008-508731 | 3/2008 |
| JP | 2008-172062 | 7/2008 |
| JP | 2009-059775 | 3/2009 |
| JP | 2009-160424 | 7/2009 |
| KR | 10-0932961 | 5/2008 |
| KR | 1020080047985 | 5/2008 |
| KR | 10-2008-0072817 | 8/2008 |
| TW | 454944 | 9/2001 |

OTHER PUBLICATIONS

Tawainese Office Action dated May 16, 2012.

\* cited by examiner

*Primary Examiner* — Saul Rodriguez
*Assistant Examiner* — Willie Berry, Jr.
(74) *Attorney, Agent, or Firm* — Jenkins, Wilson, Taylor & Hunt, P.A.

(57) ABSTRACT

A substrate processing apparatus includes a main load unit, a buffer load unit, and a transfer unit. Containers each accommodating substrates are placed on the main load unit and the buffer load unit. The buffer load unit is disposed above the main load unit and movable into and outward from a process module. Therefore, more containers can be placed in the substrate processing apparatus without increasing the footprint of the substrate processing apparatus, and thus it is possible to reduce equipment idle time during which standby substrates wait before being processed, thereby improving productivity.

5 Claims, 12 Drawing Sheets

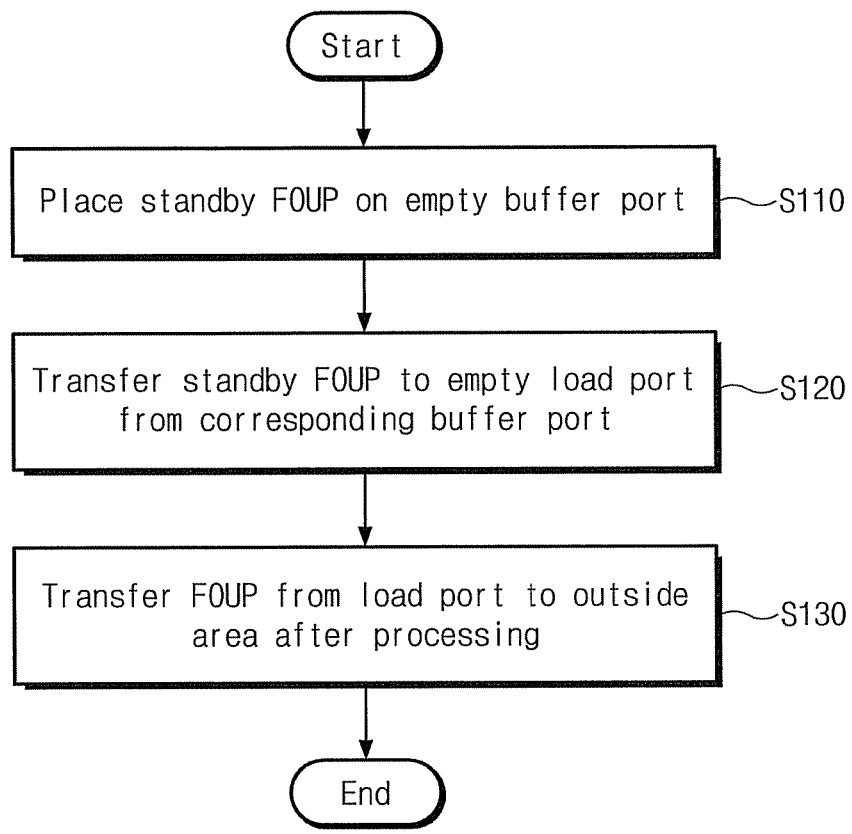

SUBSTRATE PROCESSING APPARATUS AND METHOD FOR TRANSFERRING SUBSTRATE FOR THE APPARATUS

CROSS-REFERENCE TO RELATED APPLICATIONS

This U.S. non-provisional patent application claims priority under 35 U.S.C. §119 of Korean Patent Application No. 10-2008-0081485, filed on Aug. 20, 2008, the entire contents of which are hereby incorporated by reference.

BACKGROUND OF THE INVENTION

The present invention disclosed herein relates to a substrate processing apparatus, and more particularly, to a substrate processing apparatus and a method for transferring a substrate for the substrate processing apparatus.

In a substrate manufacturing method, processes such as deposition of dielectric films and metallic materials, etching, coating with photoresist, developing, and removing of asher are repeated for a predetermined number of times so as to forming arrays of fine patterns. Although an etching or asher-removing process is performed during such substrate manufacturing processes, foreign substances are not completely removed from a substrate but remain on the substrate. For this reason, a wet cleaning process may be performed using deionized water or chemicals so as to remove such remaining substances.

Substrate cleaning apparatuses for wet cleaning may be classified into batch processors and single processors. A batch processor may include a chemical bath, a rinse bath, and a dry bath that are sized to process about 25 to 50 substrates at a time. In a batch processor, substrates are immersed in each bath for a predetermined time for removing foreign substances from the substrates. In such a batch processor, both the front and rear sides of a large number of substrates can be simultaneously processed. However, since the sizes of baths of a batch process are proportional to the size of substrates, the size and chemical consumption of the batch processor increase as the size of substrates increases. Moreover, when a substrate is cleaned in a chemical bath, foreign substances detached from a neighboring substrate can be re-attached to the substrate.

Since the sizes of recently-used substrates are large, single processors are widely used. In the case of a single processor, a substrate cleaning process is performed in a relatively small chamber capable of processing only a single substrate at a time. Specifically, in a single processor, a substrate is fixed to a chuck disposed in a chamber, and a chemical or deionized water is supplied to the top surface of the substrate through a nozzle while rotating the substrate using a motor. Since the substrate is rotated, the chemical or deionized water can spread on the substrate, and foreign substances are removed from the substrate by the spreading chemical or deionized water. Such a single processor is relatively small and suitable for uniformly cleaning a substrate as compared with a batch processor.

Generally, a single processor includes a plurality of load ports, an index robot, a buffer unit, a plurality of process chambers, and a main transfer robot that are arranged from a side of the single processor. Front opening unified pods (FOUPs) accommodating substrates are placed on the load ports, respectively. The index robot carries the substrates accommodated in the FOUP to the buffer unit, and the main transfer robot transfers the substrates from the buffer unit to the process chambers. After the substrates are cleaned in the process chambers, the main transfer robot carries the substrates from the process chambers to the buffer unit, and the index robot takes the substrates from the buffer unit and puts the substrates into the FOUP. After the cleaned substrates are accommodated in the FOUP as described, the FOUP is carried to the outside.

Generally, a FOUP is transferred by an overhead hoist transport (OHT). In detail, the OHT transfers a FOUP accommodating uncleaned substrates to an empty load port, and the OHT picks up a FOUP accommodating cleaned substrates from the load port and transfers the FOUP to an outside area.

Since such an OHT is operated with a low speed, it takes more time to transfer a FOUP using the OHT than to draw uncleaned substrates from the FOUP and put cleaned substrates into the FOUP. Moreover, the time necessary for cleaning substrates is shortened because the efficiency of a cleaning apparatus is improved owing to the development of related technology; however, the speed of OHTs is still low. Therefore, FOUPs cannot be efficiently transferred by using an OHT, thereby increasing the idle time of a cleaning apparatus and decreasing the productivity of a manufacturing process.

SUMMARY OF THE INVENTION

The present invention provides a substrate processing apparatus having improved substrate transferring efficiency.

The present invention also provides a method for transferring a substrate for the substrate processing apparatus.

In an exemplary embodiment of the present invention, a substrate processing apparatuses including a process module, a main load unit, a buffer load unit, and at least one transfer unit.

In the exemplary embodiment, the process module is configured to process a substrate. The main load unit is disposed at a front side of the process module for receiving at least one container accommodating substrates, and the main load unit is configured so that substrates are transferred between the container placed on the main load unit and the process module. The buffer load unit is disposed above the main load unit for receiving at least one container accommodating substrates, and the buffer load unit is horizontally movable into and outward from the process module. The transfer unit is disposed above the main load unit for transferring a container between the main load unit and the buffer load unit.

In an exemplary embodiment, the buffer load unit may include at least one buffer port configured to receive a container, and the buffer port may be horizontally movable into and outward from the process module.

In an exemplary embodiment, the main load unit may include at least one load port configured to receive a container, and the buffer port may be disposed above the load port and faces the load port.

In an exemplary embodiment, the buffer port may include: a guide rail disposed in the process module; and a stage coupled to the guide rail and configured to receive a container, the stage being horizontally movable on the guide rail into and outward from the process module.

In an exemplary embodiment, the transfer unit may be movable into and outward from the process module.

In an exemplary embodiment, the substrate processing apparatus may further include an overhead hoist transport unit. The overhead hoist transport may be configured to transfer a container between an outside area and the buffer load unit or the main load unit.

In another exemplary embodiment of the present invention, there are provided methods for transferring a substrate. In the methods, a standby container accommodating unprocessed substrates is placed on a buffer load unit that is movable into and outward from a process module. A standby container is transferred to a main load unit from the buffer load unit by picking up the standby container from the buffer load unit and moving the standby container vertically, so as to load substrates from the standby container to the process module and process the substrates. A container accommodating processed substrates is transferred to an outside area from the main load unit by picking up the container from the main load unit. When a standby container is transferred to the main load unit or a container accommodating processed substrates is transferred from the main load unit, the buffer load unit is placed in the process module.

In further exemplary embodiment of the present invention, there are provided methods for transferring a substrate. In the methods, a standby container accommodating unprocessed substrates is placed on a main load unit so as to load the substrates into a process module and process the substrates. After picking up a container accommodating processed substrates from the main load unit, the container is placed on a buffer load unit that is disposed above the main load unit and movable into and outward from the process module. A container accommodating processed substrates is transferred to an outside area from the buffer load unit by picking up the container from the buffer load unit. When a standby container is transferred to the main load unit or a container accommodating processed substrates is transferred to the buffer load unit, the buffer load unit is moved into the process module.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 3 is a flowchart for explaining an exemplary embodiment of a process of transferring substrates in a substrate processing apparatus according to the present invention;

DETAILED DESCRIPTION OF PREFERRED EMBODIMENTS

Preferred embodiments of the present invention will be described below in more detail with reference to the accompanying drawings. In the following description, wafers are described as examples of substrates. However, the scope and spirit of the present invention are not limited thereto.

Figure 1:
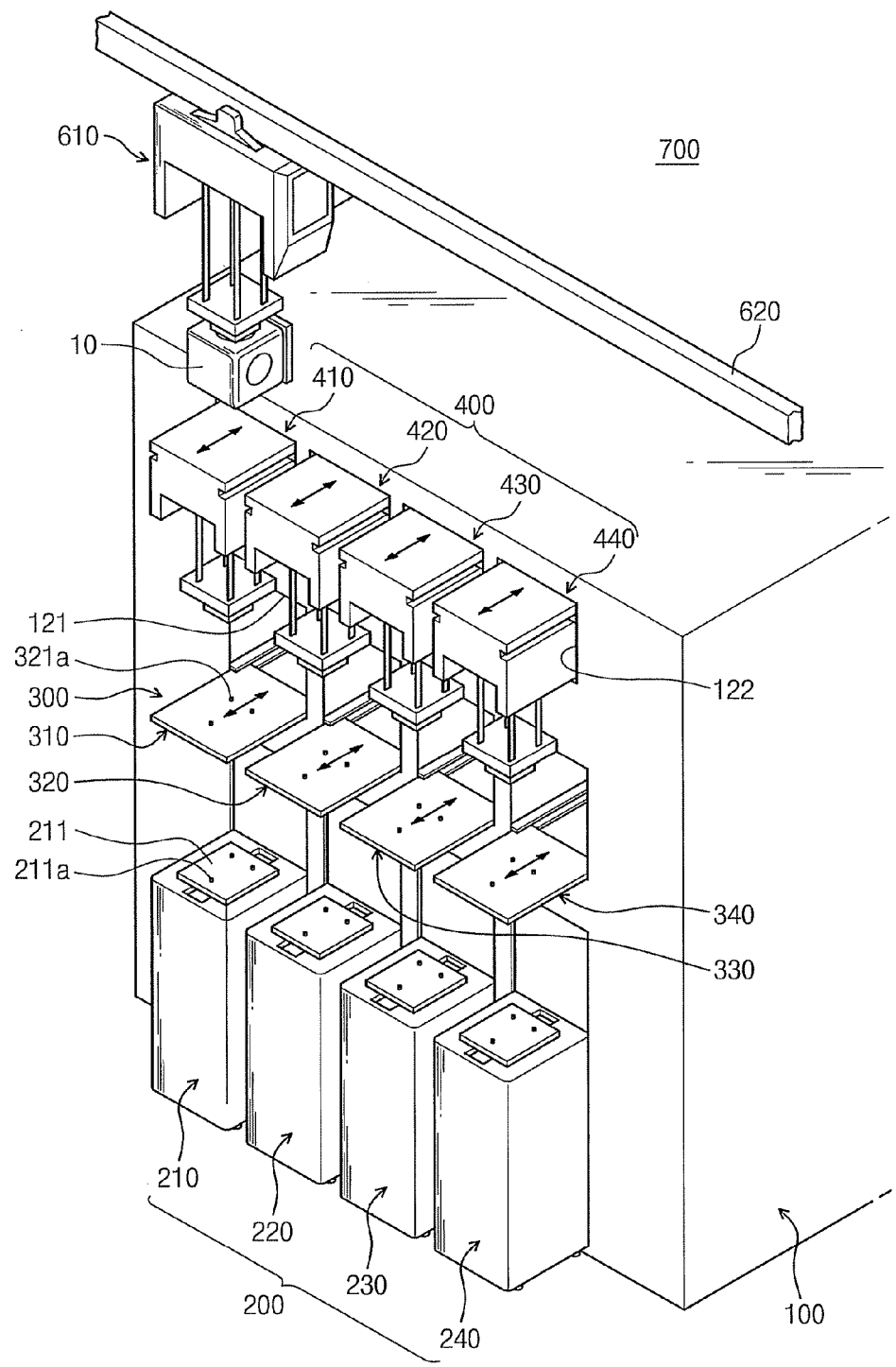
FIG. 1 is a partial perspective view illustrating an exemplary embodiment of a substrate processing apparatus according to the present invention.
Figure 2:
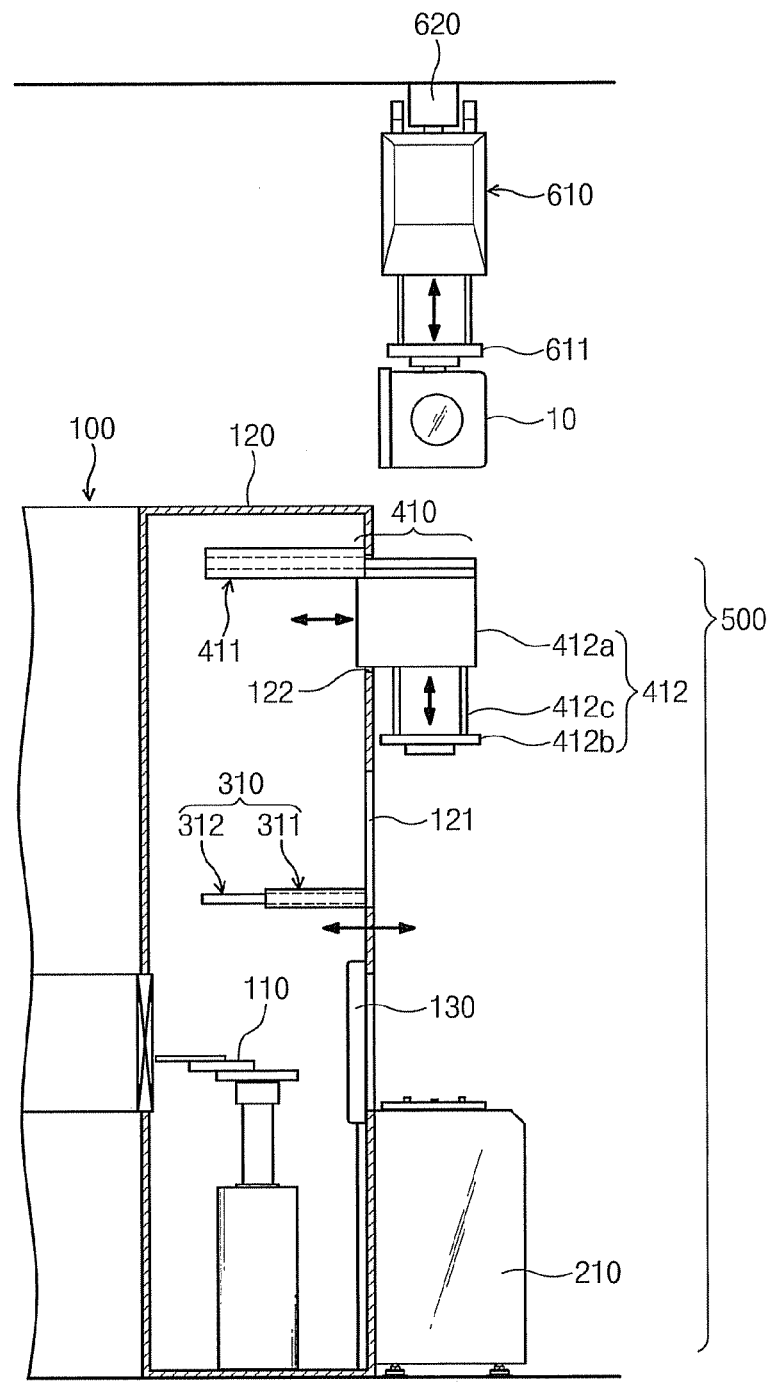
FIG. 2 is a sectional view illustrating the substrate processing apparatus of FIG. 1.

FIG. 1 is a partial perspective view illustrating an exemplary embodiment of a substrate processing apparatus 700 according to the present invention, and FIG. 2 is a sectional view illustrating the substrate processing apparatus 700 of FIG. 1.

Referring to FIGS. 1 and 2, the substrate processing apparatus 700 includes a process module 100 and a substrate supply module 500. The process module 100 is configured to process wafers. The substrate supply module 500 is configured to supply wafers (unprocessed wafers) to the process module 100 for processing the wafers and carries the wafers processed in the process module 100 to the outside.

In detail, unprocessed wafers are supplied to the substrate processing apparatus 700 in a state where the unprocessed wafers are accommodated in a front opening unified pod (FOUP) 10, and after the unprocessed wafers are processed, the processed wafers are carried out of the substrate processing apparatus 700 in a state where the processed wafers are accommodated in the FOUP 10.

In the current exemplary embodiment, the substrate processing apparatus 700 uses the FOUP 10 as a container for carrying wafers. However, instead of the FOUP 10, other containers can be used for carrying wafers.

The process module 100 includes an index robot 110 configured to pick up unprocessed wafers from the FOUP 10 carried to the substrate supply module 500. Unprocessed wafers picked up by the index robot 110 are supplied to a plurality of process chambers (not shown) for processing the wafers. In the process chambers, a processing process such as a cleaning process may be performed. After the wafers are processed, the index robot 110 loads the processed wafers back to the FOUP 10 disposed at the substrate supply module 500. That is, after the wafers are processed, the wafers are carried out of the process chambers. The index robot 110 transfers and loads the processed wafers back to the FOUP 10.

The substrate supply module 500 is disposed at the front side of the process module 100 for supplying wafers to the process module 100 in a state where the wafers are accommodated in the FOUP 10.

In detail, the substrate supply module 500 may include a main load unit 200, a buffer load unit 300, and a plurality of transfer units 400.

The main load unit 200 is disposed at the front side of the process module 100 and makes contact with the process module 100. The main load unit 200 includes a plurality of load ports 210 to 240, and a FOUP 10 can be placed on each of the load ports 210 to 240.

In the current exemplary embodiment, the main load unit 200 includes four load ports 210 to 240. However, the number of load ports 210 to 240 can be increased or decreased for the processing efficiency of the substrate processing apparatus 700.

The load ports 210 to 240 are disposed at a sidewall of a partition bay 120 in which components of the process module 100 are disposed, and a plurality of door openers 130 corresponding to the load ports 210 to 240 are disposed at the partition bay 120. The door openers 130 are used to open doors of FOUPs 10 placed on the corresponding load ports 210 to 240.

The load ports 210 to 240 are arranged in parallel with each other along the floor. Each of the load ports 210 to 240 may include a sliding plate 211 disposed at a predetermined surface for supporting a FOUP 10. The sliding plate 211 can be moved horizontally to adjust the horizontal position of a FOUP 10 placed on its top surface.

That is, when a FOUP 10 is placed on one of the load ports 210 to 240, the sliding plate 211 of the load port is moved horizontally and forwardly to place the FOUP 10 onto the door opener 130, and then the door openers 130 opens a door of the FOUP 10. After the door of the FOUP 10 is opened, the index robot 110 takes wafers out of the opened FOUP 10.

Thereafter, processed wafers are put into the opened FOUP 10, and the door openers 130 closes the door of the FOUP 10. The sliding plate 211 is moved horizontally and backward to move FOUP 10 horizontally.

Fixing protrusions 211a may be disposed on the top surface of the sliding plate 211 for fixing a FOUP 10 placed on the sliding plate 211. In this case, grooves are formed at a bottom face of the FOUP 10 and the fixing protrusions 211a may be inserted in the grooves. Thus, the fixing protrusions 211a may be coupled to a FOUP 10 placed on the sliding plate 211 for fixing the FOUP 10 to the sliding plate 211.

The buffer load unit 300 is disposed above the main load unit 200, and a plurality of FOUPs 10 can be placed on the buffer load unit 300.

In detail, the buffer load unit 300 includes a plurality of buffer ports 310 to 340. In an embodiment, the number of the buffer ports 310 to 340 is equal to the number of the load ports 210 to 240, and the positions of the buffer ports 310 to 340 correspond to the positions of the load ports 210 to 240, respectively. However, the number of the buffer ports 310 to 340 can be increased or decreased for the processing efficiency of the substrate processing apparatus 700.

The buffer ports 310 to 340 are arranged in the same direction as the load ports 210 to 240 in a manner such that the buffer ports 310 to 340 face the corresponding load ports 210 to 240, respectively.

The buffer ports 310 to 340 can be horizontally moved into and outward from the process module 100. In detail, each of the buffer ports 310 to 340 may include a guide rail 311 disposed inside the process module 100, and a stage 312 configured to receive a FOUP 10. The guide rail 311 is disposed at an inner wall of the partition bay 120 in a manner such that the guide rail 311 extends perpendicularly from the inner wall of the partition bay 120 and faces a bottom surface of the partition bay 120 at a position above the index robot 110.

The stage 312 is connected to the guide rail 311. The stage 312 may include a plurality of protrusions 312a for fixing a FOUP 10. The protrusions 312a extend from the top surface of the stage 312 for coupling with a FOUP 10 placed on the top surface of the stage 312 to fix the FOUP 10 to the stage 312. Insertion holes (not shown) are formed in the bottom surface of the FOUP 10 for receiving the protrusions 312a.

The stage 312 can be horizontally moved along the guide rail 311 into the partition bay 120 and outward from the partition bay 120. When the stage 312 is positioned outside the partition bay 120, the stage 312 faces a corresponding one of the load ports 210 to 240.

A plurality of FOUP inlet/outlet holes 121 corresponding to the buffer ports 310 to 340 are formed at the partition bay 120. The FOUP inlet/outlet holes 121 are formed at positions corresponding to the buffer ports 310 to 340, respectively, and each of the FOUP inlet/outlet holes 121 is sized so that the stage 312 can be moved through the FOUP inlet/outlet hole 121 together with a FOUP 10. The stage 312 can be taken into the process module 100 and outward from the process module 100 by horizontally moving the stage 312.

In the current exemplary embodiment, the buffer ports 310 to 340 of the buffer load unit 300 can be horizontally moved independent of each other.

The transfer units 400 are disposed above the buffer load unit 300. The transfer units 400 are configured to move FOUPs 10 between the buffer load unit 300 and the main load unit 200.

In the current exemplary embodiment, the substrate processing apparatus 700 includes four transfer units 410 to 440. However, the number of the transfer units 410 to 440 may be increased or decreased according to the number of the buffer ports 310 to 340. The number of the transfer units 410 to 440 is equal to the number of the buffer ports 310 to 340.

The transfer units 410 to 440 are arranged in the same direction as the buffer ports 310 to 340. The transfer units 410 to 440 are located at positions corresponding to the positions of the buffer ports 310 to 340, respectively. Under the transfer units 410 to 440, the buffer ports 310 to 340, and the load ports 210 to 240 are sequentially positioned.

Each of the transfer units 410 to 440 may include transfer rails 411 disposed inside the process module 100, and a container transfer part 412 configured to pick up a FOUP 10 and transfer the FOUP 10.

The transfer rails 411 are disposed at an inner wall of the partition bay 120 and extend in a direction perpendicular to the inner wall of the partition bay 120. The transfer rails 411 face the bottom surface of the partition bay 120 and are located above the index robot 110.

The container transfer part 412 is coupled to the transfer rails 411. The container transfer part 412 is movable horizontally along the transfer rails 411 into and outward from the partition bay 120. The container transfer part 412 is configured to pick up a FOUP 10 disposed at a corresponding load port or buffer port and transfer the FOUP 10 vertically.

In detail, the container transfer part 412 may include a body 412a coupled to the transfer rails 411 and movable horizontally along the transfer rails 411, a pickup part 412b disposed under the body 412a, and a wire part 412c connecting the body 412a and the wire part 412c.

Both sides of the body 412a are coupled to the transfer rails 411 and the body 412a movable horizontally along the transfer rails 411. When transferring a FOUP 10, the pickup part 412b is detachably coupled to the top side of the FOUP 10 for fixing the FOUP 10 to the container transfer part 412. An end of the wire part 412c is coupled to the body 412a, and the other end of the wire part 412c is coupled to the pickup part 412b. The wire part 412c is adjustable in length for lifting or lowering the pickup part 412b. That is, the wire part 412c adjusts the vertical position of the pickup part 412b according to a pickup position and a load position of a FOUP 10 to be transferred, so as to move the pickup part 412b to a corresponding buffer port or load port.

When the pickup part 412b is vertically moved, a buffer port corresponding to the pickup part 412b is slid into the process module 100 so as to prevent the buffer port from interfering with the pickup part 412b.

In the current exemplary embodiment, the pickup part 412b is configured to be coupled to the top side of a FOUP 10. However, the pickup part 412b can be configured to be coupled to a lateral side of a FOUP 10. Furthermore, instead of adjusting the vertical position of the pickup part 412b of the container transfer part 412 by using a wire, the vertical position of the pickup part 412b may be adjusted by using a vertically movable arm or rail.

The partition bay 120 includes a plurality of robot inlet/outlet holes 122 corresponding to the transfer units 410 to 440. The robot inlet/outlet holes 122 are located at positions corresponding to the transfer units 410 to 440, respectively, and each of the robot inlet/outlet holes 122 is sized so that the container transfer part 412 can be moved through the robot inlet/outlet hole 122. The container transfer part 412 can be taken into the process module 100 and outward from the process module 100 by horizontally moving the container transfer part 412.

An equipment rail 620 is disposed above the transfer units 400 so that an overhead hoist transfer (OHT) 610 can be moved on the equipment rail 620. Generally, the equipment rail 620 may be installed on the ceiling of a semiconductor manufacturing line where the substrate processing apparatus 700 is disposed. The OHT 610 includes a grip part 611 configured to be coupled to a FOUP 10 for transferring the FOUP 10, and the vertical position of the grip part 611 can be adjusted by using a wire. While moving along the equipment rail 620, the OHT 610 receives a FOUP 10 from another area and places the FOUP 10 on one of the load ports 210 to 240 and the buffer ports 310 to 340. In addition, the OHT 610 picks up a FOUP 10 placed on one of the load ports 210 to 240 and the buffer ports 310 to 340 and transfers the FOUP 10 to another area.

When the grip part 611 is move to one port of the load ports 210 to 240 and the buffer ports 310 to 340 so as to transfer a FOUP 10 to or from the port, the container transfer part 412 is slid into the process module 100 through the robot inlet/outlet hole 122 for prevent interference with the OHT 610.

As described above, the substrate processing apparatus 700 includes the buffer ports 310 to 340 as well as the load ports 210 to 240 for temporarily placing FOUPs 10 on the buffer ports 310 to 340. In addition, since the transfer units 400 are used to transfer FOUPs 10 between the load ports 210 to 240 and the buffer ports 310 to 340, FOUPs 10 can be carried into and out of the substrate processing apparatus 700 with less influence by the transfer speed of the OHT 610.

Accordingly, the substrate processing apparatus 700 can have a reduced time for supplying FOUPs 10 to the load ports 210 to 240 from a standby area. That is, equipment idle time can be reduced, and productivity can be improved.

Hereinafter, with reference to the accompanying drawings, detailed explanations will be given on a process of transferring standby FOUPs to the substrate processing apparatus 700 and a process of transferring FOUPs in the outside of the substrate processing apparatus 700 after a processing process is finished. In the following explanations, the load ports 210 to 240 will be referred to as first to fourth load ports 210 to 240, the buffer ports 310 to 340 will be referred to as first to fourth buffer ports 310 to 340, and the transfer units 410 to 440 will be referred to as first to fourth transfer units 410 to 440. The first to fourth load ports 210 to 240 are sequentially arranged in the same direction, the first to fourth buffer ports 310 to 340 are sequentially arranged in the same direction, and the first to fourth transfer units 410 to 440 are sequentially arranged in the same direction.

FIG. 3 is a flowchart for explaining a process of transferring substrates in a substrate processing apparatus according to an embodiment of the present invention, and FIGS. 4A through 4D are views for explaining the substrate transferring process of FIG. 3.

Figure 4A:
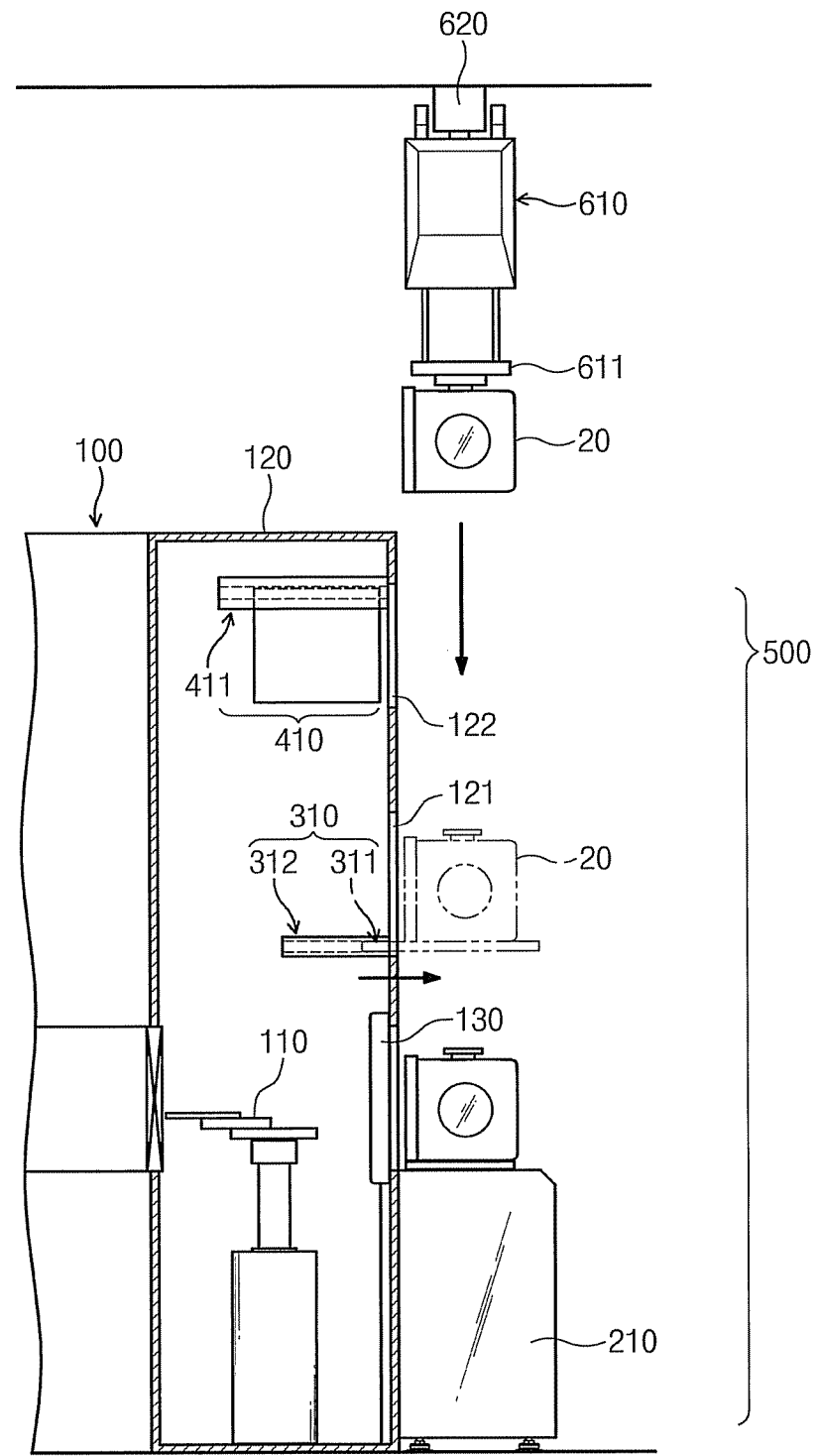
FIGS. 4A through 4D are views for explaining the substrate transferring process of FIG. 3.

Referring to FIGS. 1, 3 and 4A, the OHT 610 carries a FOUP 20 from an outside area to an empty buffer port of the first to fourth buffer ports 310 to 340 where no FOUP is placed (operation S110).

In the current exemplary embodiment, standby FOUPs (accommodating unprocessed wafers) are placed on the first to fourth buffer ports 310 to 340, and each of the FOUPs is kept at that position until a corresponding one of the first to fourth load ports 210 to 240 is emptied. At this time, the stages 312 of the first to fourth buffer ports 310 to 340, and the container transfer parts 412 of the first to fourth transfer units 410 to 440 may be placed in the process module 100 for preventing interference with the OHT 610.

In the current exemplary embodiment, standby FOUPs are supplied to the first to fourth buffer ports 310 to 340 in the same manner. Therefore, in the following explanation, the first buffer port 310 is taken as an example for explaining how a standby FOUP is placed on an empty buffer port.

As shown in FIG. 4A, if the first buffer port 310 is emptied, the stage 312 of the first buffer port 310 is horizontally moved along the guide rail 311 outward from the process module 100 together with a standby FOUP 20. Next, the grip part 611 of the OHT 610 is lowered from an upper position of the first buffer port 310 so as to place the standby FOUP 20 on the stage 312 of the first buffer port 310.

Meanwhile, if one of the first to fourth load ports 210 to 240 is emptied, a standby FOUP 20 is picked up from a corresponding one of the first to fourth buffer ports 310 to 340 and is placed on the emptied load port by one of the first to fourth transfer units 410 to 440 (operation S120).

In the current exemplary embodiment, standby FOUPs are supplied to the first to fourth load ports 210 to 240 in the same manner. Therefore, in the following explanation, the first load port 210 is taken as an example for giving a detailed explanation on how a standby FOUP is placed on an empty load port.

Figure 4B:
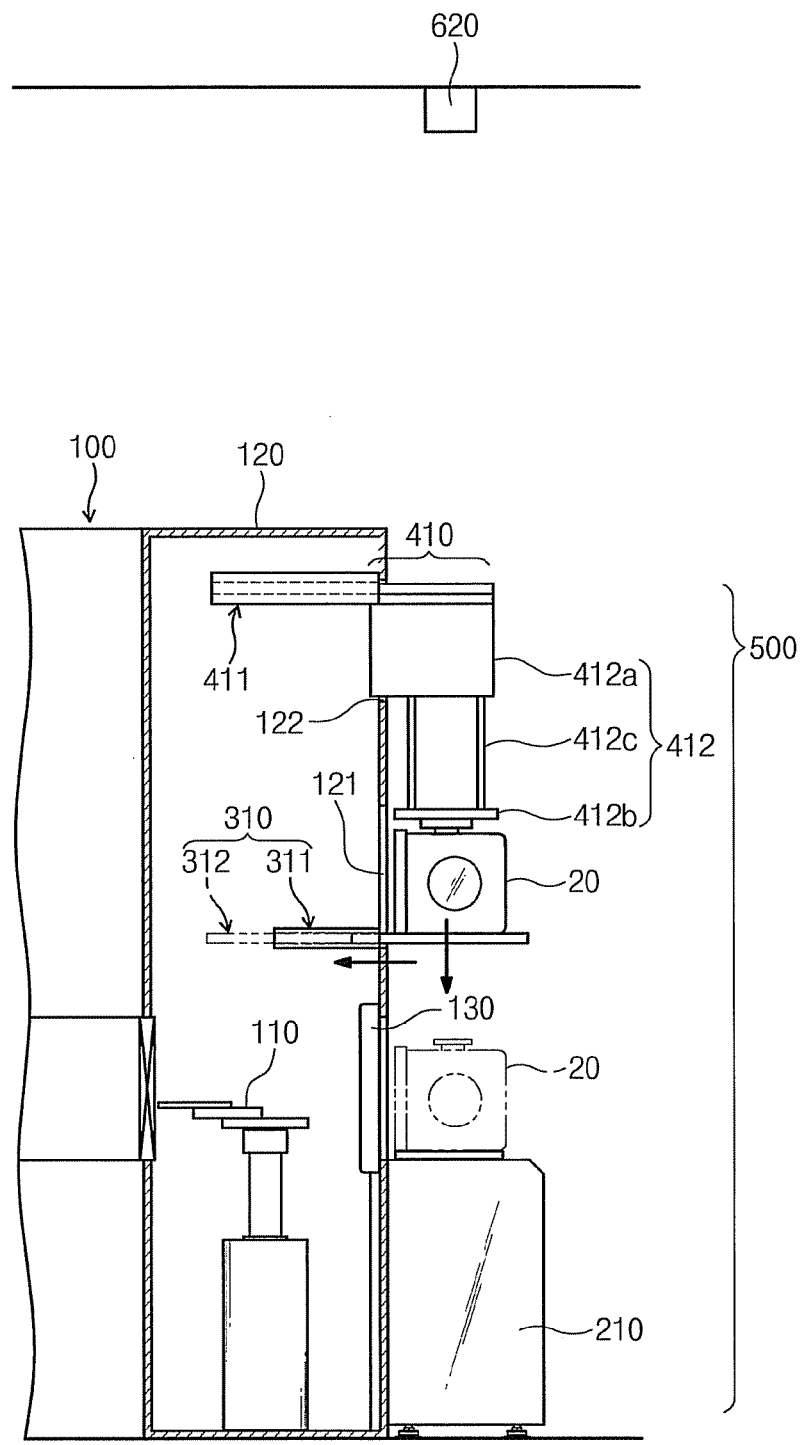

Referring to FIG. 4B, when the first load port 210 is emptied, the stage 312 of the corresponding first buffer port 310, and the container transfer part 412 of the corresponding first transfer unit 410 are horizontally moved to the outside of the process module 100. Then, the container transfer part 412 of the first transfer unit 410 picks up a standby FOUP 20 from the stage 312 of the first buffer port 310. At this time, the standby FOUP 20 is fixed to the pickup part 412b of the container transfer part 412.

Thereafter, the stage 312 of the first buffer port 310 is moved into the process module 100 for preventing interference with the container transfer part 412.

Figure 4C:
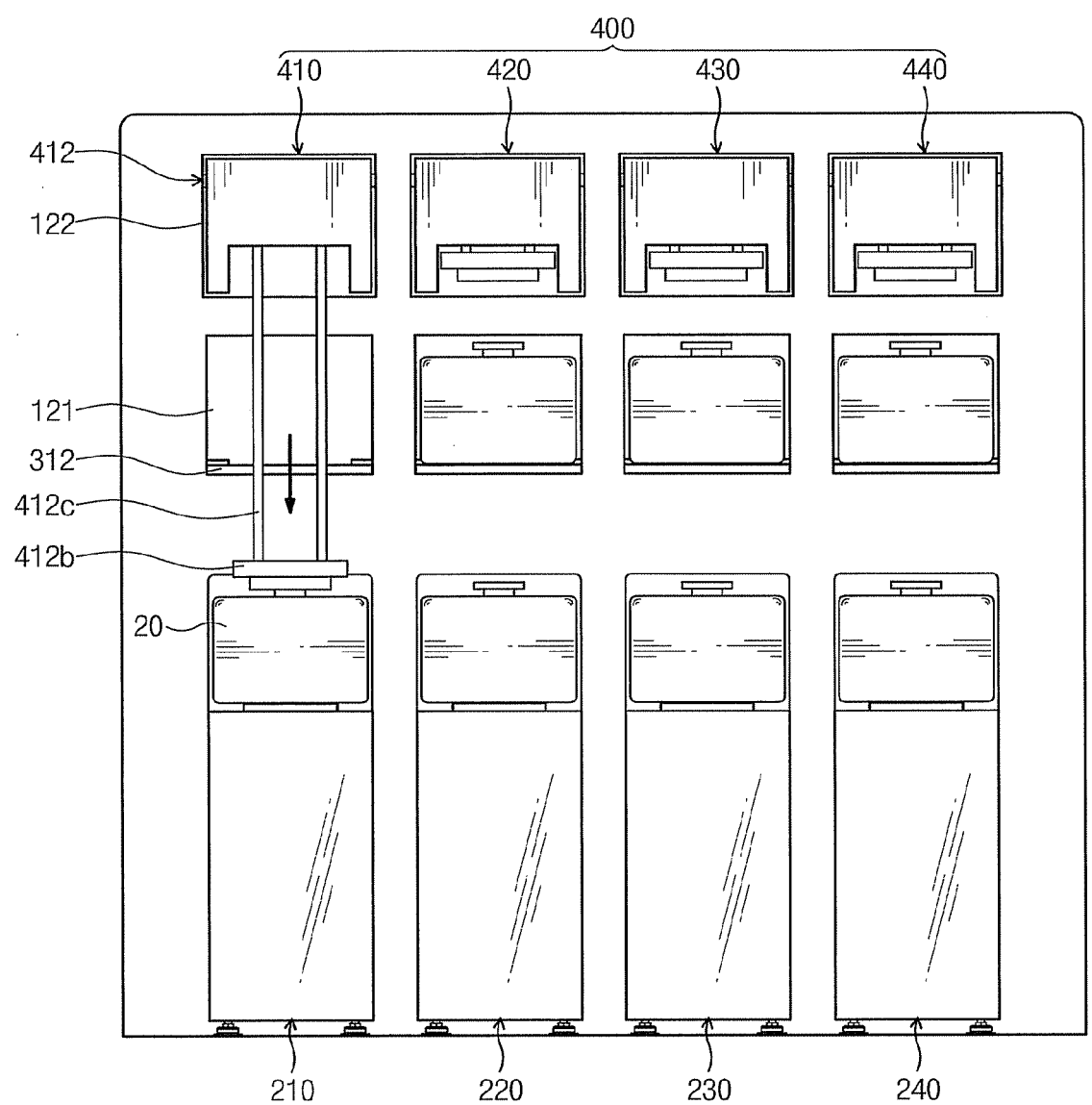

Referring to FIG. 4C, the pickup part 412b of the container transfer part 412 is lowered so as to place the standby FOUP 20 on the first load port 210 together with the standby FOUP 20. Next, the container transfer part 412 is detached from the standby FOUP 20 and moved upward to its original position. Since the standby FOUP 20 was transferred from the first buffer port 310 to the first load port 210, the first buffer port 310 is in an empty state. Then, another standby FOUP 20 is transferred to the empty first buffer port 310 by the OHT 610.

Figure 4D:
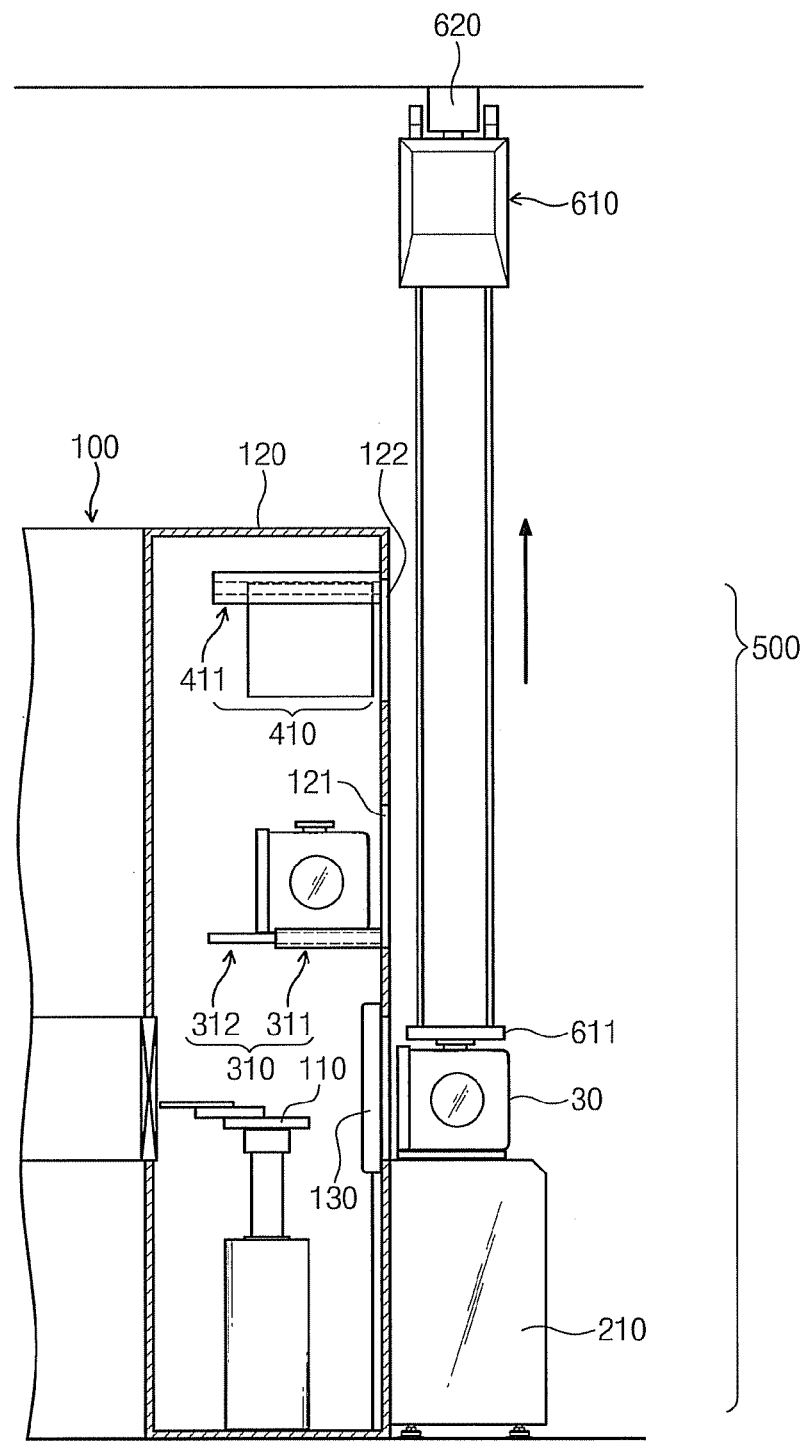

Referring to FIGS. 3 and 4D, processed wafers are charged into one of FOUPs 10 placed on the first to fourth load ports 210 to 240, and the OHT 610 picks up the FOUP 10 and transfers the FOUP 10 to an outside area (operation S130).

In the current embodiment, FOUPs in which processed wafers are charged are transferred from the first to fourth load ports 210 to 240 in the same manner. Therefore, in the following description, the first load port 210 is taken as an example for explaining how a FOUP in which processed wafers are charged is transferred.

Referring to FIG. 4D, after processed wafers are charged into a FOUP 30 placed on the first load port 210, the OHT 610 is moved to an upper position of the first load port 210. Next, the grip part 611 of the OHT 610 is lowered to pick up the FOUP 30 from the first load port 210. Then, the grip part 611 is lifted, and the FOUP 30 is in which processed wafers are charged is transferred to an outside area.

As a result, the first load port 210 is emptied. Thus, the first transfer unit 410 transfers a standby FOUP from the first buffer port 310 to the first load port 210. How a standby FOUP is transferred to an empty load port is already explained in operation S120 with reference to FIGS. 4B and 4C. Thus, a description thereof will not be repeated.

As explained above, according to the substrate transferring method for the substrate processing apparatus 700, standby FOUPs to be supplied to the load ports 210 to 240 are temporarily placed on the buffer ports 310 to 340. In addition, in the substrate processing apparatus 700, FOUPs are transferred to the load ports 210 to 240 by using the transfer units 410 to 440 instead of using the OHT 610. Therefore, standby FOUPs can be rapidly supplied to the load ports 210 to 240 with less influence by the transfer speed of the OHT 610, and thus the idle time of the substrate processing apparatus 700 can be reduced to increase productivity.

In the above description, an explanation has been given on the case where the OHT 610 is used to place standby FOUPs on the first to fourth buffer ports 310 to 340, and after processed wafers are charged into FOUPs placed on the first to fourth load ports 210 to 240, the OHT 610 is used to pick up the FOUPs from the first to fourth load ports 210 to 240 and transfer the FOUPs to an outside area. That is, in the substrate transferring method, substrates are transferred in a state where the buffer ports 310 to 340 are set as loading points of the OHT 610, and the load ports are set as unloading points as the OHT 610.

In the following description, a process of transferring substrates will be explained for the case where the buffer ports 310 to 340 are set as unloading points of the 610, and the load ports 210 to 240 are set as loading points of the OHT 610.

Figure 5:
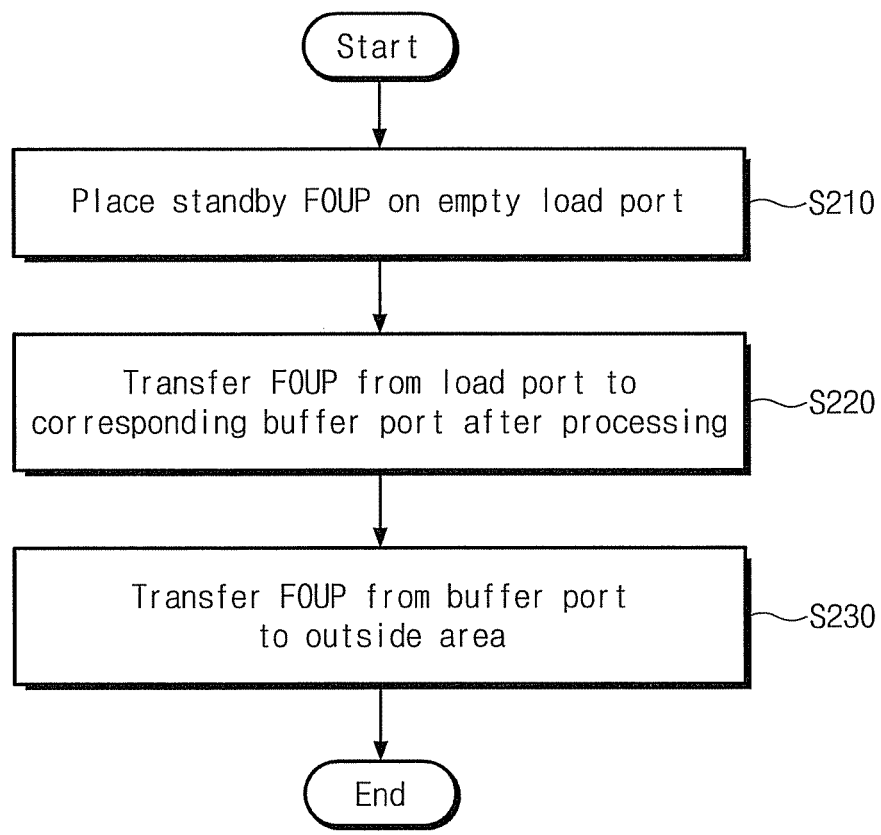
FIG. 5 is a flowchart for explaining an another exemplary embodiment of a process of transferring substrates in a substrate processing apparatus according to the present invention.

FIG. 5 is a flowchart for explaining a process of transferring substrates in a substrate processing apparatus according to another embodiment of the present invention, and FIGS. 6A through 6D are views for explaining the substrate transferring process of FIG. 5.

Figure 6A:
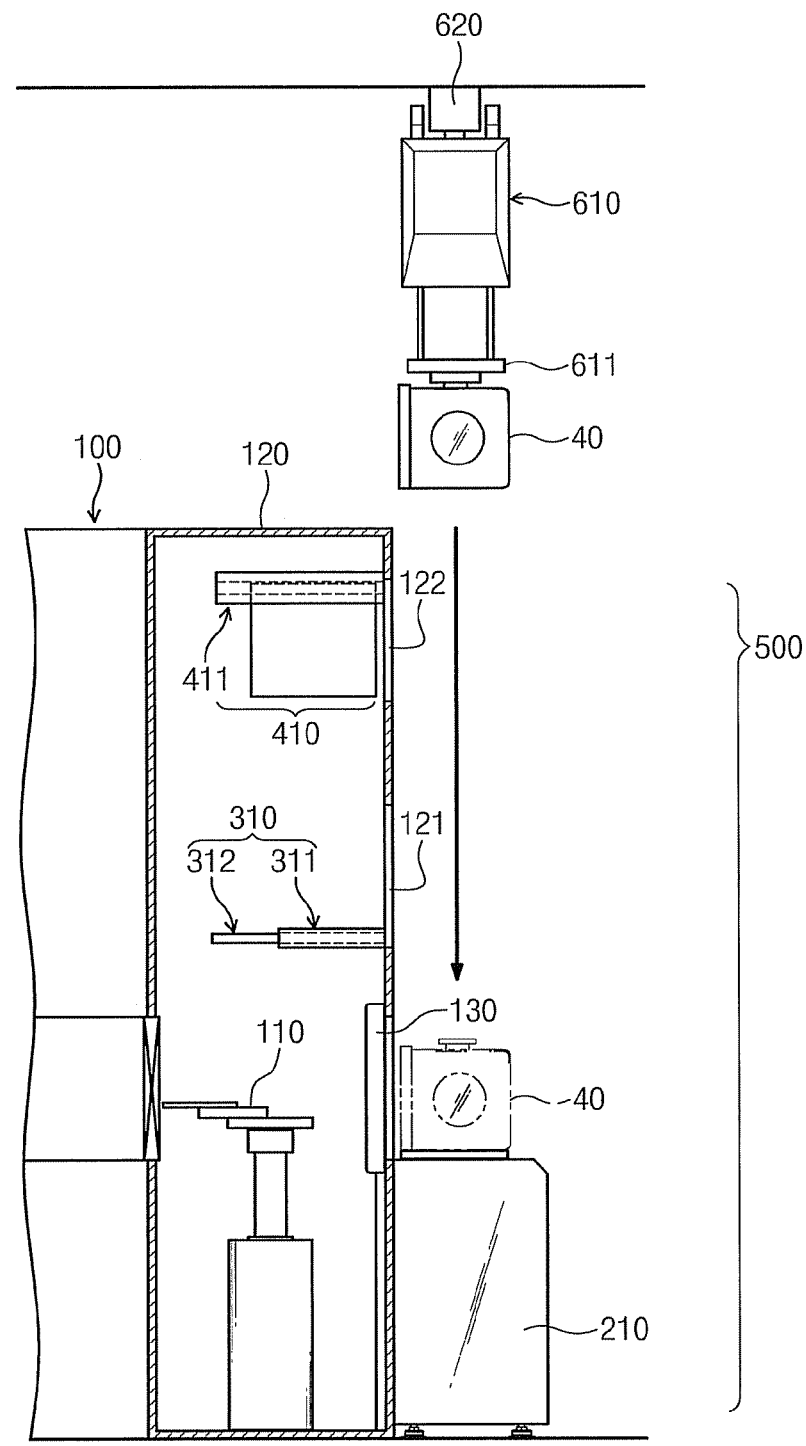
FIGS. 6A through 6D are views for explaining the substrate transferring process of FIG. 5.

Referring to FIGS. 1, 5 and 6A, the OHT 610 carries a FOUP 20 from an outside area to an empty buffer port of the first to fourth load ports 210 to 240 where no FOUP is placed (operation S210). At this time, the stages 312 of the first to fourth buffer ports 310 to 340, and the container transfer parts 412 of the first to fourth transfer units 410 to 440 may be placed in the process module 100 for preventing interference with the OHT 610.

In the current exemplary embodiment, standby FOUPs are supplied to the first to fourth load ports 210 to 240 in the same manner. Therefore, in the following explanation, the first load port 210 is taken as an example for explaining how a standby FOUP is placed on an empty load port.

As shown in FIG. 6A, if the first load port 210 is emptied, the grip part 611 of the OHT 610 is lowered towards the first load port 210 to place a standby FOUP 40 on the first load port 210.

Meanwhile, if processed wafers are charged into one of FOUPs 40 placed on the first to fourth load ports 210 to 240, a corresponding one of the first to fourth transfer units 410 to 440 picks up the FOUP 40 charged with processed wafers and transfers the FOUP 40 to a corresponding one of the first to fourth buffer ports 310 to 340 (operation S220).

In the current embodiment, FOUPs 40 charged with processes wafers are transferred from the first to fourth load ports 210 to 240 to the corresponding first to fourth buffer ports 310 to 340 in the same manner. Therefore, in the following description, the buffer ports 310 is taken as an example for explaining how a FOUP charged with processed wafers is transferred from the main load unit 200 to the buffer load unit 300.

Figure 6B:
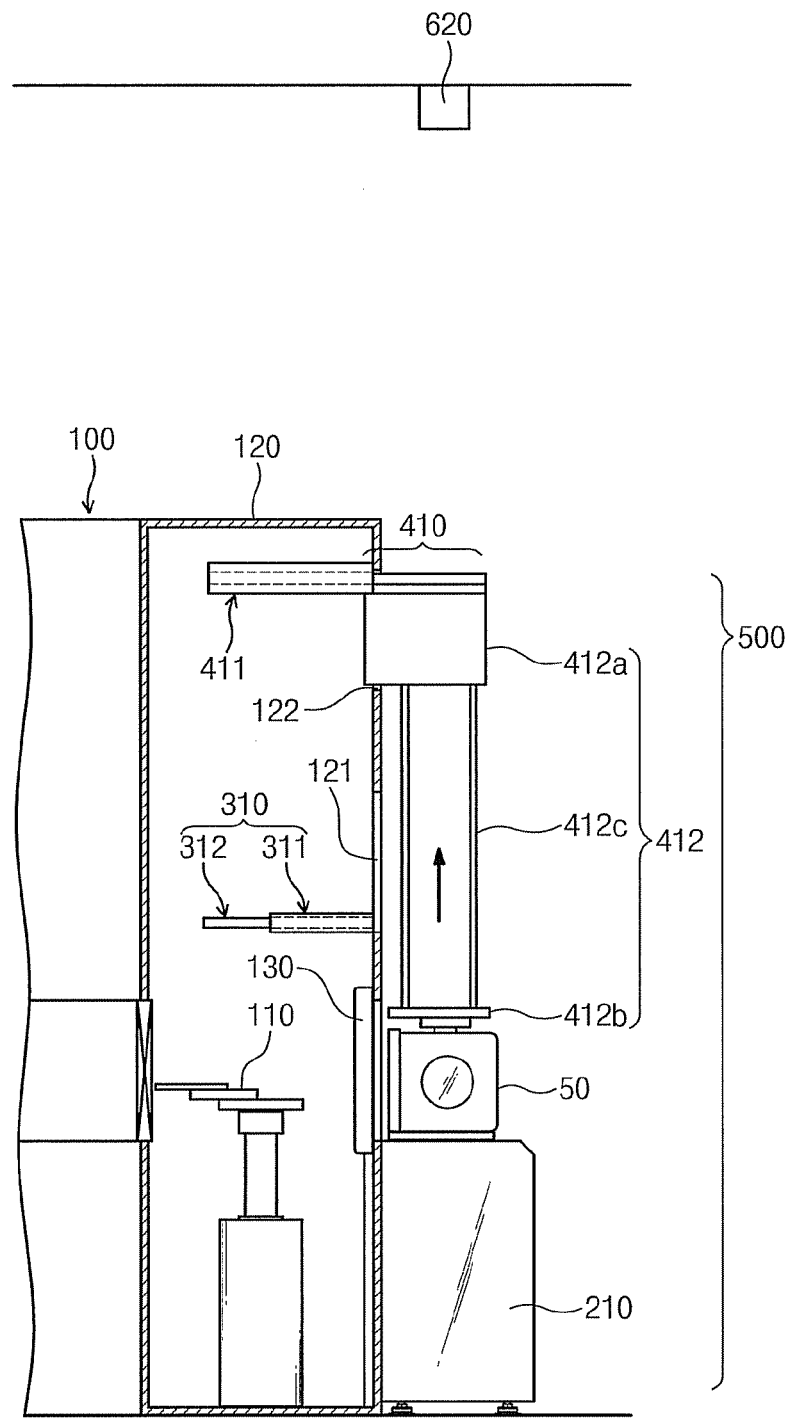

Referring to FIG. 6B, if processed wafers are completely charged into a FOUP 50 placed on the first load port 210, the container transfer part 412 of the corresponding first transfer units 410 is horizontal moved along the transfer rails 411 of the first transfer units 410 to the outside of the process module 100. At this time, if the stage 312 of the first buffer port 310 is positioned outward from the process module 100, the stage 312 of the first buffer port 310 is moved into the process module 100.

In the current embodiment, the container transfer part 412 waits in the process module 100. Alternatively, however, the container transfer part 412 may wait outside the process module 100.

Next, the pickup part 412b of the container transfer part 412 is lowered toward the first load port 210 to pickup the FOUP 50 charged with processed wafers. At this time, the pickup part 412b is coupled to the top side of the FOUP 50 charged with processed wafers.

Figure 6C:
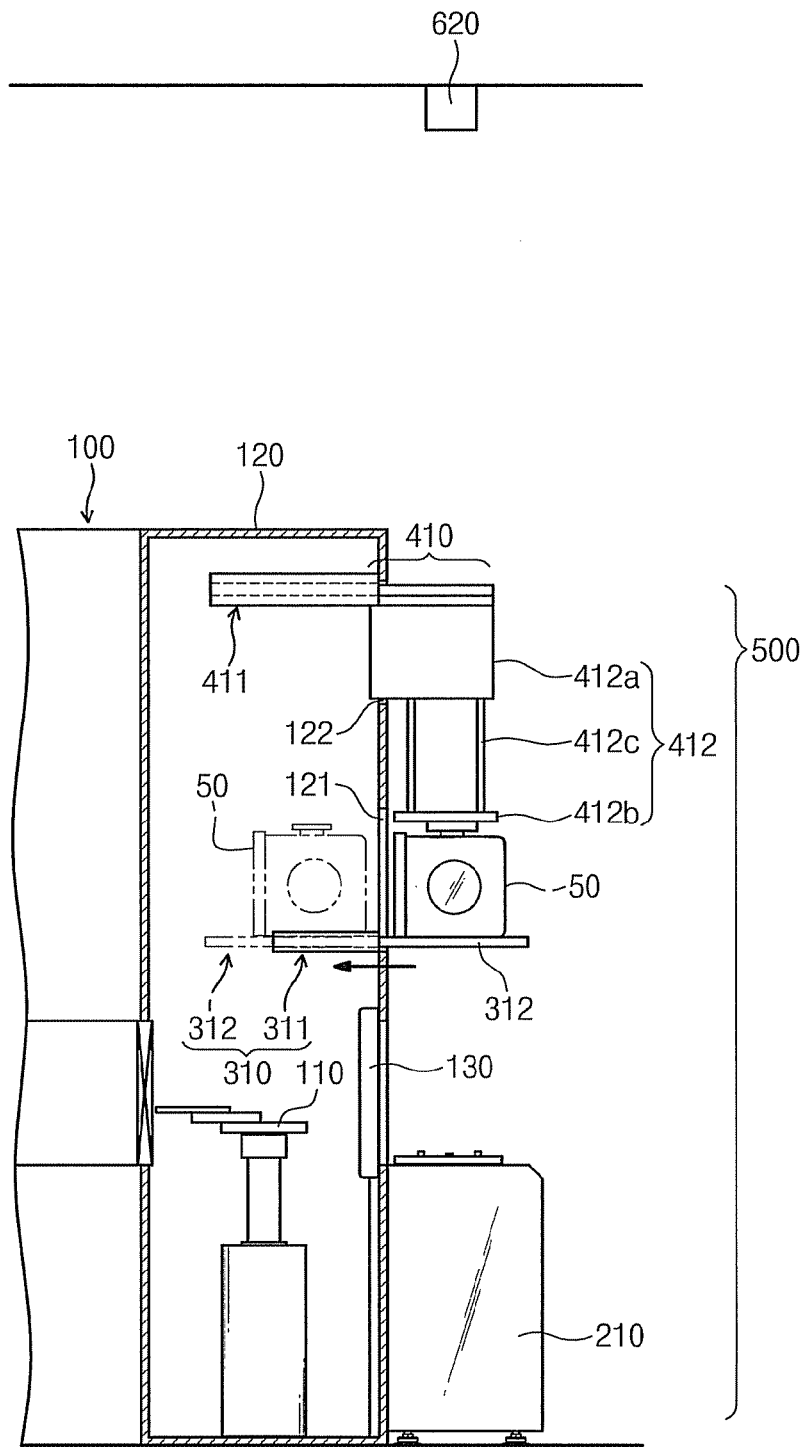

Referring to FIG. 6C, the pickup part 412b of the first container transfer part 412 is lifted so that when the stage 312 of the first buffer port 310 is moved outward together with the FOUP 50, the pickup part 412b is higher than the stage 312 of the first buffer port 310. Next, the stage 312 of the first buffer port 310 is moved along the guide rail 311 outward from the inside of the process module 100. Then, the pickup part 412b places the FOUP 50 on the stage 312 of the first buffer port 310. Thereafter, the pickup part 412b is decoupled from the FOUP 50 and lifted to its original position.

As a result, the first load port 210 is emptied, and thus a standby FOUP can be directly supplied to the first load port 210 from the OHT 610 as described in operation S210 with reference to FIG. 6A.

In this way, FOUPs in which processed wafers are charged are transferred from the first to fourth load ports 210 to 240 to the corresponding first to fourth buffer ports 310 to 340, respectively, and the FOUPs wait at the first to fourth buffer ports 310 to 340 until they are transferred to an outside area by the OHT 610.

Figure 6D:
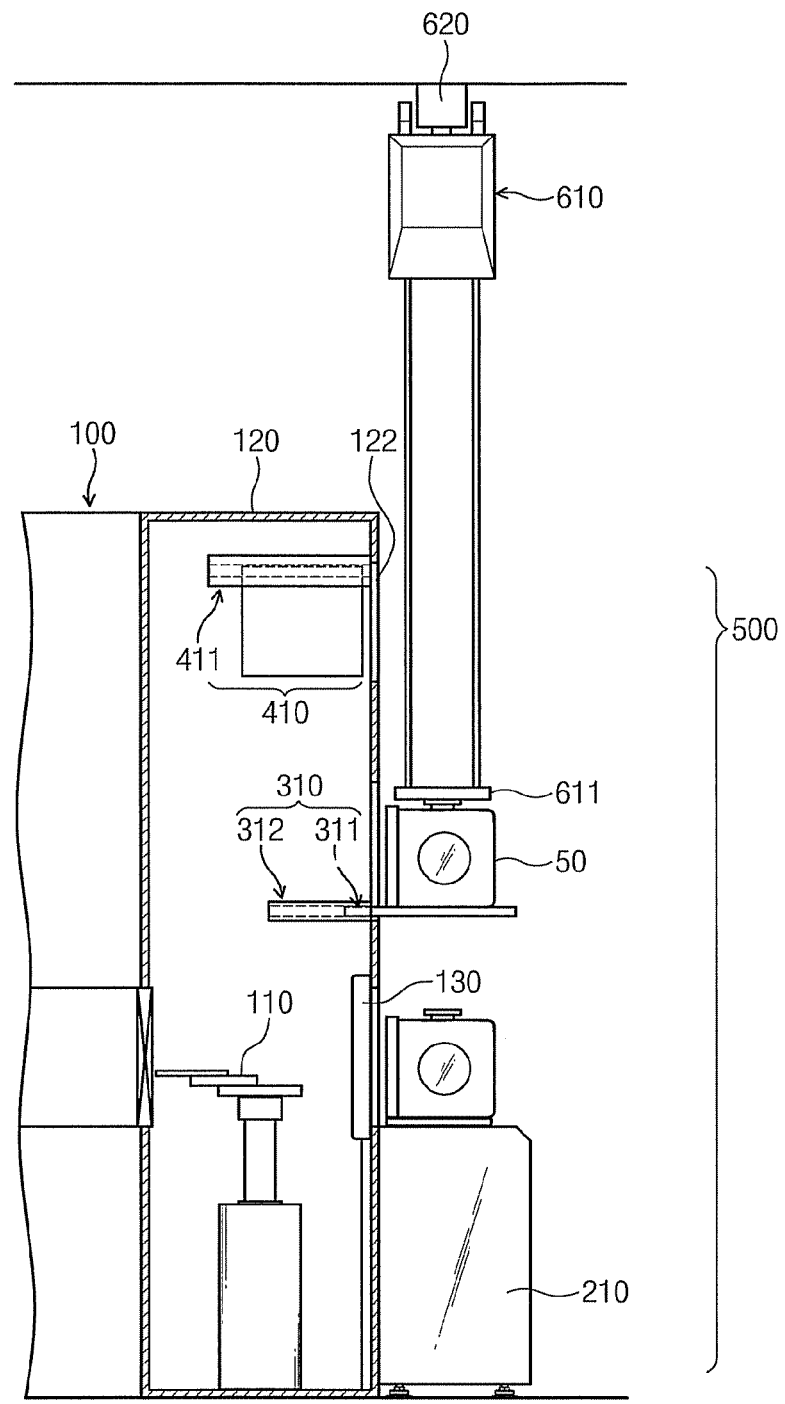

Referring to FIGS. 1, 5 and 6D, FOUPs in which processed wafers are charged are transferred from the first to fourth buffer ports 310 to 340 to an outside area by the OHT 610 (S230). At this time, the container transfer parts 412 of the first to fourth transfer units 410 to 440 are placed in the process module 100 for preventing interference with the OHT 610.

In the current exemplary embodiment, FOUPs placed on the first to fourth buffer ports 310 to 340 are transferred to an outside area in the same manner. Thus, in the following description, the first buffer port 310 is taken as an example for giving an detailed explanation on a process of transferring a FOUP in which processed wafers are charged.

As shown in FIG. 6D, the OHT 610 is moved to a position above the first buffer port 310. Next, the grip part 611 of the OHT 610 is lowered to pick up the FOUP 50 charged with processed wafers. Then, the grip part 611 of the OHT 610 is lifted, and the FOUP 50 charged with processed wafers is transferred to an outside area.

As described above, according to the substrate transferring method for the substrate processing apparatus 700, FOUPs in which processed wafers are charged are temporarily placed on the buffer ports 310 to 340. In addition, in the substrate processing apparatus 700, FOUPs are transferred to the buffer ports 310 to 340 by using the transfer units 410 to 440.

Therefore, in the substrate processing apparatus 700, FOUPs in which processed wafers are charged are placed on the load ports for less time, and standby FOUPs can be rapidly supplied to the load ports 210 to 240. Therefore, equipment idle time can be reduced, and productivity can be improved.

According to the present invention, in the substrate processing apparatus, the buffer load unit is provided above the main load unit for receiving containers. Therefore, more containers can be placed in the substrate processing apparatus without having to increase the footprint of the substrate processing apparatus, and thus it is possible to reduce equipment idle time during which standby substrates wait before being processed, thereby improving productivity.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing apparatus comprising:
a process module configured to process a substrate;
a main load unit disposed at a front side of the process module for receiving at least one container accommodating substrates, the main load unit being configured so that substrates are transferred between the container placed on the main load unit and the process module;
a buffer load unit disposed above the main load unit for receiving at least one container accommodating substrates, the buffer load unit being horizontally movable into and outward from the process module; and
at least one transfer unit disposed above the main load unit for transferring a container between the main load unit and the buffer load unit;
wherein the buffer load unit comprises at least one buffer port configured to receive a container, and the buffer port is horizontally movable into and outward from the process module,
wherein the main load unit comprises at least one load port configured to receive a container, and the buffer port is disposed above the load port and faces the load port, and
wherein the transfer unit is movable into and outward from the process module.

2. The substrate processing apparatus of claim 1, wherein the transfer unit comprises:
a transfer rail disposed in the process module; and
a container transfer part coupled to the transfer rail and horizontally movable on the transfer rail into and outward from the process module, the container transfer part being configured to pick up a container placed on the buffer port or the load port and transfer the container.

3. The substrate processing apparatus of claim 2, wherein the container transfer part comprises:
a body coupled to the transfer rail and horizontally movable on the transfer rail; and
a pickup part coupled to a lower side of the body and movable upward and downward, the pickup part being configured to pick up a container.

4. An substrate processing apparatus comprising:
a process module configured to process a substrate;
a plurality of load ports disposed at a front side of the process module and each configured to receive a container accommodating substrates, the load ports being configured so that substrates are transferred between the containers placed on the load ports and the process module;
a plurality of buffer ports disposed above the load ports and each configured to receive a container accommodating substrates, the buffer ports being horizontally movable into and outward from the process module; and
a plurality of transfer units disposed above the load ports for transferring containers between the load ports and the buffer ports,
wherein the load ports, the buffer ports, and the transfer units are arranged at positions corresponding to each other in an one-to-one relation, and
each of the transfer units is configured to transfer a container between a corresponding pair of the load ports and the buffer ports, and
wherein each of the transfer units is movable into and outward from the process module.

5. The substrate processing apparatus of claim 4, further comprising an overhead hoist transport unit configured to transfer a container between an outside area and one of the buffer ports and the load ports.

* * * * *